US007034308B2

(12) United States Patent
Bakker et al.

(10) Patent No.: US 7,034,308 B2
(45) Date of Patent: *Apr. 25, 2006

(54) RADIATION SYSTEM, CONTAMINATION BARRIER, LITHOGRAPHIC APPARATUS, DEVICE MANUFACTURING METHOD AND DEVICE MANUFACTURED THEREBY

(75) Inventors: Levinus Pieter Bakker, Helmond (NL); Vadim Yevgenyevich Banine, Helmond (NL); Ralph Kurt, Eindhoven (NL); Frank Jeroen Pieter Schuurmans, Valkenswaard (NL); Yurii Victorovitch Sidelnikov, Moscow Region (RU)

(73) Assignee: ASML Netherlands B.V., Veldhoven (NL)

( * ) Notice: Subject to any disclaimer, the term of this patent is extended or adjusted under 35 U.S.C. 154(b) by 0 days.

This patent is subject to a terminal disclaimer.

(21) Appl. No.: 10/873,646

(22) Filed: Jun. 23, 2004

(65) Prior Publication Data

US 2005/0077483 A1 Apr. 14, 2005

(30) Foreign Application Priority Data

Jun. 27, 2003 (EP) .................................. 03077012

(51) Int. Cl.
*G21G 5/00* (2006.01)
*G03F 7/20* (2006.01)
*G03B 27/52* (2006.01)
(52) U.S. Cl. ............................ 250/370.08; 250/370.09; 250/365; 250/504 R; 250/372; 250/363.1; 359/350; 359/359; 362/296; 362/302
(58) Field of Classification Search ............. 250/492.1, 250/492.2, 504 R, 370.08, 370.09, 372, 461.1; 359/359, 350, 351, 884; 362/290–293, 263, 362/296, 302
See application file for complete search history.

(56) References Cited

U.S. PATENT DOCUMENTS

| 4,292,055 | A | | 9/1981 | De Castella et al. | |
|---|---|---|---|---|---|
| 4,980,563 | A | * | 12/1990 | George et al. | 250/492.2 |
| 5,216,539 | A | * | 6/1993 | Boher et al. | 359/359 |
| 5,906,429 | A | * | 5/1999 | Mori et al. | 362/293 |
| 6,072,852 | A | * | 6/2000 | Hudyma | 378/34 |
| 6,359,969 | B1 | * | 3/2002 | Shmaenok | 378/156 |
| 6,426,506 | B1 | * | 7/2002 | Hudyma | 250/492.2 |
| 6,498,351 | B1 | * | 12/2002 | Kruizinga et al. | 250/492.2 |
| 6,566,668 | B1 | * | 5/2003 | Rauch et al. | 250/504 R |
| 6,586,757 | B1 | * | 7/2003 | Melnychuk et al. | 250/504 R |
| 6,838,684 | B1 | * | 1/2005 | Bakker et al. | 250/492.2 |
| 6,859,259 | B1 | * | 2/2005 | Bakker et al. | 355/53 |

(Continued)

FOREIGN PATENT DOCUMENTS

EP 0 858 249 A1 8/1998

(Continued)

*Primary Examiner*—John R. Lee
*Assistant Examiner*—Bernard E. Souw
(74) *Attorney, Agent, or Firm*—Pillsbury Winthrop Shaw Pittman, LLP (57) ABSTRACT

A radiation system includes a contamination barrier, e.g., a foil trap, between a collector, for example a normal incidence collector, and a radiation source, such that radiation coming from the source passes the foil trap twice. The radiation passes the contamination barrier once before hitting the collector and a second time after reflection by the collector. The foil trap includes lamellas that are parallel to both the radiation coming from the light source, and to the radiation reflected by the collector. The radiation is thus not obstructed by the foil trap. In this way, a normal incidence collector, which is used with a plasma produced source, can be protected from debris coming from a EUV source.

23 Claims, 4 Drawing Sheets

U.S. PATENT DOCUMENTS

| | | | |
|---|---|---|---|
| 2002/0171922 A1* | 11/2002 | Shiraishi et al. | 359/359 |
| 2004/0135985 A1* | 7/2004 | Bakker et al. | 355/69 |
| 2004/0179182 A1* | 9/2004 | Bakker | 355/69 |
| 2004/0184014 A1* | 9/2004 | Bakker et al. | 355/30 |
| 2005/0077483 A1* | 4/2005 | Bakker et al. | 250/492.1 |
| 2005/0098741 A1* | 5/2005 | Bakker et al. | 250/492.2 |
| 2005/0111080 A1* | 5/2005 | Bakker et al. | 359/350 |
| 2005/0122491 A1* | 6/2005 | Bakker et al. | 355/30 |

FOREIGN PATENT DOCUMENTS

| | | | |
|---|---|---|---|
| EP | 1 182 510 A1 | | 2/2002 |
| EP | 1211918 A1 | * | 5/2002 |
| EP | 1 211 918 A1 | | 6/2002 |
| EP | 1 223 468 A1 | | 7/2002 |
| EP | 1 274 287 A1 | | 1/2003 |
| EP | 1 309 234 A2 | | 5/2003 |
| EP | 1309234 A2 | * | 7/2003 |
| EP | 1274287 A1 | * | 8/2003 |
| JP | 2001-68297 | | 3/2001 |
| JP | 2004165160 | * | 9/2003 |

\* cited by examiner

RADIATION SYSTEM, CONTAMINATION BARRIER, LITHOGRAPHIC APPARATUS, DEVICE MANUFACTURING METHOD AND DEVICE MANUFACTURED THEREBY

CROSS REFERENCE TO RELATED APPLICATIONS

This application claims priority to European Patent Application 03077012.7, filed Jun. 27, 2003, the entire contents of which are herein incorporated by reference.

BACKGROUND OF THE INVENTION

1. Field of the Invention

The present invention relates to a radiation system, a contamination barrier, a lithographic apparatus, a device manufacturing method and a device manufactured thereby.

2. Description of the Related Art

The term "patterning device" as here employed should be broadly interpreted as referring to a device that can be used to endow an incoming radiation beam with a patterned cross-section, corresponding to a pattern that is to be created in a target portion of the substrate. The term "light valve" can also be used in this context. Generally, the pattern will correspond to a particular functional layer in a device being created in the target portion, such as an integrated circuit or other device (see below). An example of such a patterning device includes a mask. The concept of a mask is well known in lithography, and it includes mask types such as binary, alternating phase-shift, and attenuated phase-shift, as well as various hybrid mask types. Placement of such a mask in the radiation beam causes selective transmission (in the case of a transmissive mask) or reflection (in the case of a reflective mask) of the radiation impinging on the mask, according to the pattern on the mask. In the case of a mask, the support will generally be a mask table, which ensures that the mask can be held at a desired position in the incoming radiation beam, and that it can be moved relative to the beam if so desired.

Another example of a patterning device includes a programmable mirror array. One example of such a device is a matrix-addressable surface having a viscoelastic control layer and a reflective surface. The basic principle behind such an apparatus is that addressed areas of the reflective surface reflect incident light as diffracted light, whereas unaddressed areas reflect incident light as undiffracted light. Using an appropriate filter, the undiffracted light can be filtered out of the reflected beam, leaving only the diffracted light behind. In this manner, the beam becomes patterned according to the addressing pattern of the matrix-addressable surface. An alternative embodiment of a programmable mirror array employs a matrix arrangement of small mirrors, each of which can be individually tilted about an axis by applying a suitable localized electric field, or by employing piezoelectric actuators. Again, the mirrors are matrix-addressable, such that addressed mirrors will reflect an incoming radiation beam in a different direction to unaddressed mirrors. In this manner, the reflected beam is patterned according to the addressing pattern of the matrix-addressable mirrors. The required matrix addressing can be performed using suitable electronics. In both of the situations described above, the patterning device can include one or more programmable mirror arrays. More information on mirror arrays as here referred to can be found, for example, in U.S. Pat. Nos. 5,296,891 and 5,523,193, and PCT Patent Application Publications WO 98/38597 and WO 98/33096, which are incorporated herein by reference. In the case of a programmable mirror array, the support may be embodied as a frame or table, for example, which may be fixed or movable as required.

Another example of a patterning device includes a programmable LCD array. An example of such a construction is given in U.S. Pat. No. 5,229,872, which is incorporated herein by reference. As above, the support may be embodied as a frame or table, for example, which may be fixed or movable as required.

For purposes of simplicity, the rest of this text may, at certain locations, specifically direct itself to examples involving a mask and mask table. However, the general principles discussed in such instances should be seen in the broader context of the patterning device as set forth above.

Lithographic projection apparatus can be used, for example, in the manufacture of integrated circuits (ICs). In such a case, the patterning device may generate a circuit pattern corresponding to an individual layer of the IC, and this pattern can be imaged onto a target portion (e.g., including one or more dies) on a substrate (silicon wafer) that has been coated with a layer of radiation-sensitive material (resist). In general, a single wafer will contain a whole network of adjacent target portions that are successively irradiated via the projection system, one at a time. In current apparatus, employing patterning by a mask on a mask table, a distinction can be made between two different types of machine. In one type of lithographic projection apparatus, each target portion is irradiated by exposing the entire mask pattern onto the target portion at once. Such an apparatus is commonly referred to as a wafer stepper or step-and-repeat apparatus. In an alternative apparatus, commonly referred to as a step-and-scan apparatus, each target portion is irradiated by progressively scanning the mask pattern under the projection beam in a given reference direction (the "scanning" direction) while synchronously scanning the substrate table parallel or anti-parallel to this direction. Since, in general, the projection system will have a magnification factor M (generally<1), the speed V at which the substrate table is scanned will be a factor M times that at which the mask table is scanned. More information with regard to lithographic devices as here described can be found, for example, in U.S. Pat. No. 6,046,792, incorporated herein by reference.

In a manufacturing process using a lithographic projection apparatus, a pattern (e.g., in a mask) is imaged onto a substrate that is at least partially covered by a layer of radiation-sensitive material (resist). Prior to this imaging, the substrate may undergo various procedures, such as priming, resist coating and a soft bake. After exposure, the substrate may be subjected to other procedures, such as a post-exposure bake (PEB), development, a hard bake and measurement/inspection of the imaged features. This array of procedures is used as a basis to pattern an individual layer of a device, e.g., an IC. Such a patterned layer may then undergo various processes such as etching, ion-implantation (doping), metallization, oxidation, chemo-mechanical polishing, etc., all intended to finish off an individual layer. If several layers are required, then the whole procedure, or a variant thereof, will have to be repeated for each new layer. Eventually, an array of devices will be present on the substrate (wafer). These devices are then separated from one another by a technique such as dicing or sawing, whence the individual devices can be mounted on a carrier, connected to pins, etc. Further information regarding such processes can be obtained, for example, from the book "Microchip Fabrication: A Practical Guide to Semiconductor Processing", Third Edition, by Peter van Zant, McGraw Hill Publishing Co., 1997, ISBN 0-07-067250-4, incorporated herein by reference.

For the sake of simplicity, the projection system may hereinafter be referred to as the "lens." However, this term should be broadly interpreted as encompassing various types of projection systems, including refractive optics, reflective optics, and catadioptric systems, for example. The radiation system may also include components operating according to any of these design types to direct, shape or control the beam of radiation, and such components may also be referred to below, collectively or singularly, as a "lens." Further, the lithographic apparatus may be of a type having two or more substrate tables (and/or two or more mask tables). In such "multiple stage" devices the additional tables may be used in parallel or preparatory steps may be carried out on one or more tables while one or more other tables are being used for exposures. Dual stage lithographic apparatus are described, for example, in U.S. Pat. Nos. 5,969,441 and 6,262,796, both incorporated herein by reference.

A radiation system is known from, for example, U.S. Pat. No. 6,359,969. The radiation system includes a foil trap wherein each lamella essentially points in a radial direction when viewed from the radiation source. In this way, the radiation coming from the radiation source, is not obstructed by the lamellas, or obstructed only partially, while debris coming from the radiation source will be captured on the lamellas. In other words, the lamellas are focused with a focus at the position of the radiation source.

Up to now, there has been consensus among the laser-produced extreme ultra violet (EUV) source suppliers that it is not possible to use the foil trap technique to protect a normal incidence (NI) collector from source-produced debris. The reason for this is the fact that the EUV beam as produced by the radiation source has to pass a foil trap twice, i.e., first from the radiation source to the normal incidence collector, and then for a second time, as a reflected beam, away from the NI-collector. This is not possible with a foil trap in which all the lamellas are focused to one particular point, as described in U.S. Pat. No. 6,359,969.

SUMMARY OF THE INVENTION

It is an aspect of the present invention to introduce a contamination barrier, e.g., a foil trap, into a radiation system with a normal incidence collector. This aspect is achieved according to the invention in a radiation system including a radiation source; a collector configured to focus radiation coming from the radiation source; a contamination barrier configured to trap contamination particles coming from the radiation source, the contamination barrier being positioned between the radiation source and the collector so as to pass through radiation coming from the radiation source, wherein the collector is configured so that radiation reflected by the collector will pass the contamination barrier and the contamination barrier includes a plurality of lamellas positioned in respective planes which are parallel to a propagation direction of the reflected radiation. The contamination barrier is configured in a way that light may pass the foil trap twice, with minimal obstruction of the lamellas. Known foil traps have lamellas which are focused to the light source, so light can only pass the foil trap once.

In one embodiment, the collector is configured such that the incident radiation coming from the radiation source is substantially normal to a surface of the collector, the collector having a curved inner surface defining an imaginary ellipsoidal with a first and a second focus, the radiation source being situated in the first focus, and the respective planes of the lamellas all intersect at a line through the first and second focus. In this embodiment the collector is called a normal incidence (NI) collector. The radiation system is able to produce a focused beam of radiation in the second focus point while the contamination barrier will protect the collector from being contaminated by particles from the radiation source.

In another embodiment, the radiation source includes a laser produced plasma source. A laser produced plasma source is actually a 'free standing' point source, so radiation reflected by the NI collector is not obstructed by any arrangement producing the radiation.

In another embodiment, the contamination barrier includes an outer ring to support the lamellas, the outer ring having a minimal diameter so that the outer ring is situated outside a conus formed by a circumference of the collector and the second focus. In this way, the outer ring is kept out of the beam, and reflected radiation is not obstructed in any way by the outer ring.

In yet another embodiment, the outer ring is shaped as a slice of a cone, the cone having its tip at approximately the position of the radiation source. In this way, the surface of the outer ring facing the source is minimal, so heat production in the outer ring is kept to a minimum.

The contamination barrier may include an inner ring to support the lamellas, the inner ring being shaped as a slice of a cone having its tip at approximately the position of the radiation source. The inner ring needs to be as small as possible as to not obstruct the radiation beam. The lower limit of the dimensions of the inner ring is the fact that enough space should be available to support the lamellas. A conical ring is desirable in this situation.

The present invention also relates to a lithographic projection apparatus including a radiation system as described above; a support configured to support a patterning device, the patterning device configured to pattern the beam according to a desired pattern; a substrate table configured to hold a substrate; and a projection system configured to project the patterned beam onto a target portion of the substrate.

The present invention also relates to a device manufacturing method including providing a beam of radiation using a radiation system as described above; providing the beam with a pattern in its cross-section; and projecting the patterned beam of radiation onto a target portion of the layer of radiation-sensitive material.

Although specific reference may be made in this text to the use of the apparatus according to the present invention in the manufacture of ICs, it should be explicitly understood that such an apparatus has many other possible applications. For example, it may be employed in the manufacture of integrated optical systems, guidance and detection patterns for magnetic domain memories, liquid-crystal display panels, thin-film magnetic heads, etc. It should be appreciated that, in the context of such alternative applications, any use of the terms "reticle", "wafer" or "die" in this text should be considered as being replaced by the more general terms "mask", "substrate" and "target portion", respectively.

In the present document, the terms "radiation" and "beam" are used to encompass all types of electromagnetic radiation, including ultraviolet (UV) radiation (e.g., with a wavelength of 365, 248, 193, 157 or 126 nm) and extreme ultra-violet (EUV) radiation (e.g., having a wavelength in the range 5–20 nm), as well as particle beams, such as ion beams or electron beams.

BRIEF DESCRIPTION OF THE DRAWINGS

Embodiments of the present invention will now be described, by way of example only, with reference to the accompanying schematic drawings in which corresponding reference symbols indicate corresponding parts, and in which.

DETAILED DESCRIPTION

Figure 1:
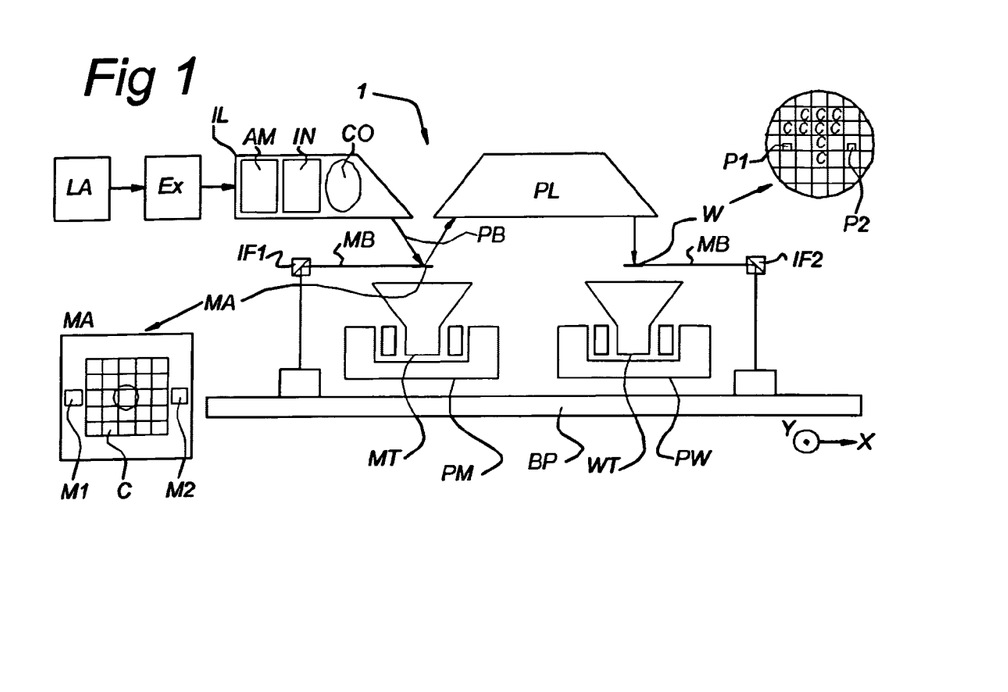
FIG. 1 depicts a lithographic projection apparatus according to an embodiment of the present invention.

FIG. 1 schematically depicts a lithographic projection apparatus 1 according to an embodiment of the present invention including a radiation system Ex, IL configured to supply a beam PB of radiation (e.g., EUV radiation). In this particular case, the radiation system also includes a radiation source LA. A first object table (mask table) MT is provided with a mask holder configured to hold a mask MA (e.g., a reticle) and is connected to first positioning device PM that accurately positions the mask with respect to a projection system ("lens") PL. A second object table (substrate table) WT is provided with a substrate holder is configured to hold a substrate W (e.g., a resist-coated silicon wafer) and is connected to second positioning device PW that accurately positions the substrate with respect to item the projection system. The projection system PL (e.g., mirrors) images an irradiated portion of the mask MA onto a target portion C (e.g., including one or more dies) of the substrate W.

As here depicted, the apparatus is of a reflective type (i.e., has a reflective mask). However, in general, it may also be of a transmissive type. Alternatively, the apparatus may employ another kind of patterning device, such as a programmable mirror array of a type as described above.

The radiation source LA produces EUV radiation. The radiation is fed into an illumination system (illuminator) IL, either directly or after having traversed a conditioning device(s), for example a beam expander Ex. The illuminator IL may include an adjusting device(s) AM configured to set the outer and/or inner radial extent (commonly referred to as σ-outer and σ-inner, respectively) of the intensity distribution in the beam. In addition, it will generally include various other components, such as an integrator IN and a condenser CO. In this way, the beam PB impinging on the mask MA has a desired uniformity and intensity distribution in its cross-section.

It should be noted with regard to FIG. 1 that the radiation source LA may be within the housing of the lithographic projection apparatus, but that it may also be remote from the lithographic projection apparatus, the radiation beam which it produces being led into the apparatus (e.g., with the aid of suitable directing mirrors).

The beam PB subsequently intercepts the mask MA, which is held on a mask table MT. Having passed the mask MA, the beam PB passes through the projection system PL, which focuses the beam PB onto a target portion C of the substrate W. With the aid of the second positioning device PW (and an interferometric measuring device IF2), the substrate table WT can be moved accurately, e.g., so as to position different target portions C in the path of the beam PB. Similarly, the first positioning device PM (and an interferometric measuring device IF1) can be used to accurately position the mask MA with respect to the path of the beam PB, e.g., after mechanical retrieval of the mask MA from a mask library, or during a scan. In general, movement of the object tables MT, WT will be realized with the aid of a long-stroke module (coarse positioning) and a short-stroke module (fine positioning), which are not explicitly depicted in FIG. 1. However, in the case of a wafer stepper, as opposed to a step-and-scan apparatus, the mask table MT may just be connected to a short stroke actuator, or may be fixed. Mask MA and substrate W may be aligned using mask alignment marks M1, M2 and substrate alignment marks P1, P2.

The depicted apparatus can be used in two different modes:

1. In step mode, the mask table MT is kept essentially stationary, and an entire mask image is projected at once (i.e., a single "flash") onto a target portion C. The substrate table WT is then shifted in the X and/or Y directions so that a different target portion C can be irradiated by the beam PB; and 2. In scan mode, essentially the same scenario applies, except that a given target portion C is not exposed in a single "flash". Instead, the mask table MT is movable in a given direction (the "scanning" direction, e.g., the Y direction) with a speed v, so that the beam PB is caused to scan over a mask image. Concurrently, the substrate table WT is simultaneously moved in the same or opposite direction at a speed V=Mv, in which M is the magnification of the projection system PL (typically, M=1/4 or 1/5). In this manner, a relatively large target portion C can be exposed, without having to compromise on resolution.

Figure 2:
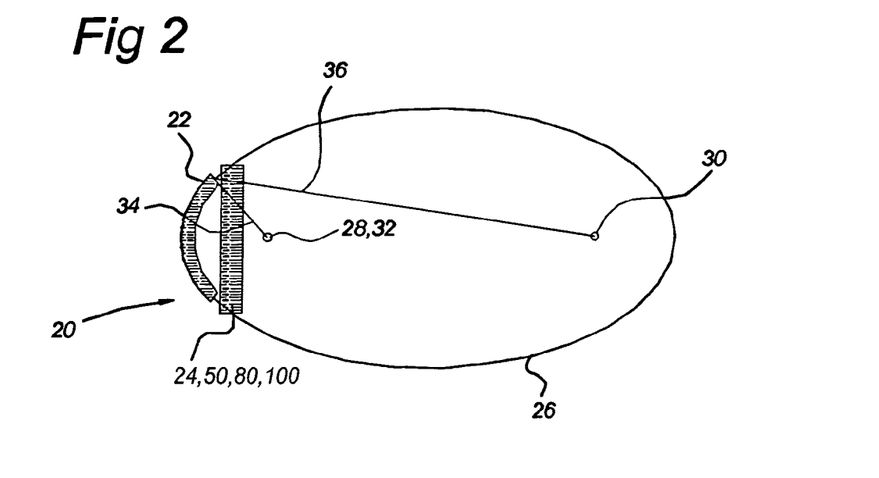
FIG. 2 depicts a side view of a part of a radiation system according to the present invention.

FIG. 2 depicts a cross-sectional view of a radiation system 20 according to an embodiment of the present invention. The radiation system 20 includes a NI collector 22 and a contamination barrier 24, 50, 80, or 100 (e.g., a foil trap). An inner surface of the NI collector 22 is curved defining an ellipsoidal surface 26. The ellipsoidal surface 26 includes two foci 28, 30, as shown in FIG. 2. In the focus 28 nearest to the NI collector 22, a radiation source 32 is situated. The radiation source 32 may be a laser produced plasma source. In FIG. 2, an EUV-ray 34, 36 is focused in the focus 30 by the NI collector 22. An incident ray 34 is emitted by the radiation source 32 and hits the NI collector 22. The foil trap 24 is situated between the radiation source 32 and the NI collector 22. The incident ray 34 will pass the foil trap 24 for the first time on its way to the NI collector 22. After being reflected by the NI collector 22, the incident ray 34 becomes a reflected ray 36 which will pass the foil trap 24 on its way to the focus 30. The radiation will thus pass the foil trap 24 twice. The incident ray 34 and the reflected ray 36 lie in a plane that intersects a line through to foci 28 and 30. Due to this arrangement, the foil trap 24 will not obstruct the radiation.

The radiation system 20 may be used in the apparatus 1 of FIG. 1 in place of the source LA. As the source 32 is located at the focus 28 of the ellipsoidal inner surface 26 of the NI collector 22, in the case where the radiation system 20 is provided to the apparatus 1 of FIG. 1, the source 32 would be located within the housing of the apparatus 1 as described above. In the event that the radiation system 20 is used in place of the source LA, the beam produced by the radiation system 20 may still traverse a conditioning device, for example the beam expander Ex.

Figure 3:
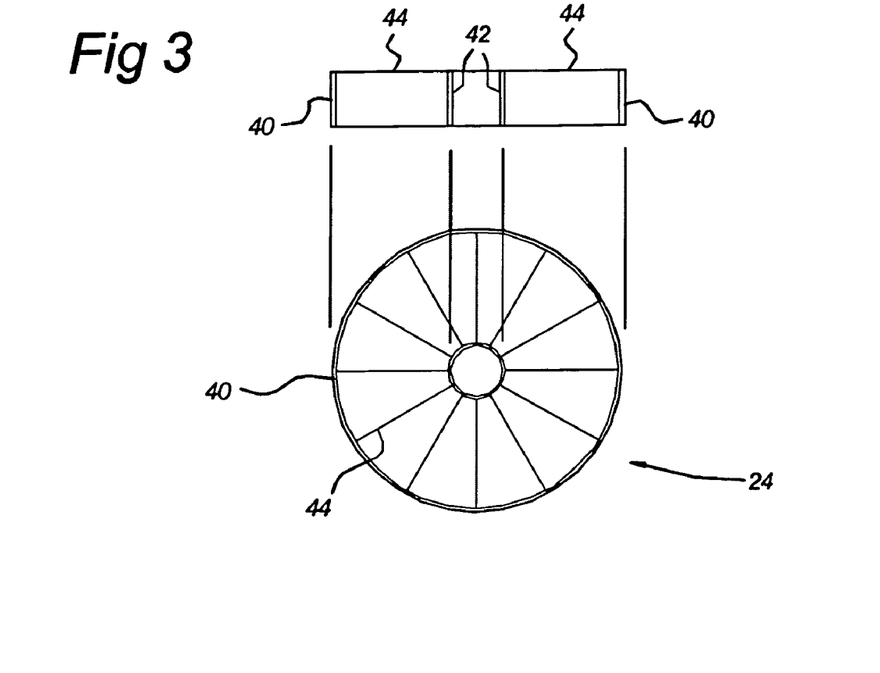
FIG. 3 depicts a front view and a cross-sectional view, respectively, of the contamination barrier of FIG. 2.

FIG. 3 depicts a front view and a cross-sectional view, respectively, of the foil trap 24. The foil trap 24 includes an outer ring 40 and an inner ring 42 to support lamellas 44. The outer ring 40 has a minimal diameter so that the outer ring 40 is situated outside a cone formed by a circumference of the NI collector 22 and the focus 30. This cone is depicted by the EUV-ray 36 in FIG. 2. It this way, the outer ring 40 will not obstruct any radiation to or from the NI collector 22. FIG. 3 also depicts a cross section of the foil trap 24. In this embodiment, the lamellas 44 are essentially rectangular. The inner and outer rings 40, 42 are cylindrical. In this way a very simple foil trap is provided.

Figure 4:
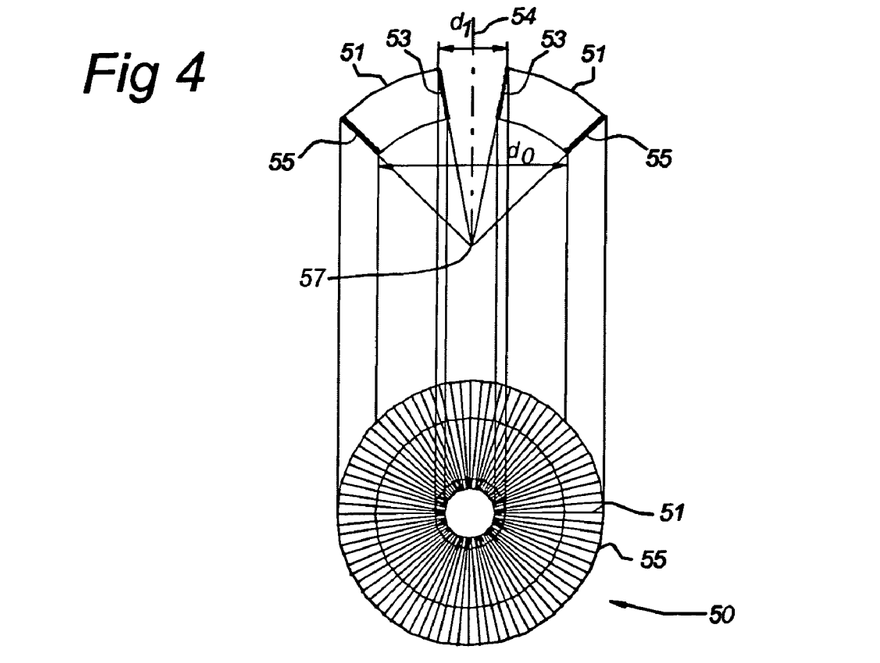
FIG. 4 depicts a front view and a cross-sectional view, respectively, of another embodiment of a contamination barrier.

FIG. 4 depicts a front view and a cross-sectional view, respectively, of another embodiment of a contamination barrier 50 (e.g., a foil trap). The foil trap 50 includes a plurality of curved lamellas 51. The foil trap 50 further includes an inner ring 53 and an outer ring 55. The inner ring 53 and the outer ring 55 are shaped as slices of a cone, wherein a minimum diameter $d_0$ of the outer ring 55 is larger than a maximum diameter $d_1$ of the inner ring 53. Dot conical rings 53, 55 share the same main axis 54. Furthermore, surfaces of the rings 53, 55 point to one central point 57. In the radiation system, the radiation source 32 is approximately positioned at the central point 57 of the rings 53, 55. The central point 57 also corresponds to the first focus 28 of the NI collector 22. The conical inner and outer rings 53, 55 face the radiation source with their edges. This means that little radiation will hit the rings 53, 55 so that heat production in the rings 53, 55 is minimized. Additionally, the conical inner ring 53 is desirably as small as possible since it obstructs radiation coming from the NI collector 22. However, if the inner ring 53 is too small, it will not be possible to connect lamellas 51 to the inner ring 53. The lamellas 51 have a certain thickness, so the number of lamellas being attached to the inner ring 53 will be limited if the surface of the inner ring 53 is small. In this embodiment the inner ring 53 is conical, the mean diameter of the inner ring 53 can be small while the maximum diameter, i.e., the diameter at the NI collector facing side of the inner ring 53 can be sufficiently large to receive all the lamellas 51.

The inner and outer edges of the lamellas 51 are so that the nearest edge to the radiation source 32 is essentially circular, as shown in FIG. 4. In this way the edges of the lamellas 51 facing the radiation source will be equally distant from the radiation source 32, and this on its turn, results in a uniform heating of the lamellas 51, which minimizes mechanical stress in the lamellas 51.

As discussed above, the rings 40, 42, 53, 55 support the lamellas in such a way that both the incident and the reflected rays 34 and 36 are obstructed as little as possible, i.e., the support structure (i.e., the rings) is kept out of the beam. Only a small part of the radiation near a main axis of the foil trap 42, 50 is blocked by the inner ring 42, 53 of the foil trap 24, 50. It should be appreciated that the outer ring 40, 55 will be supported by a wall or another type of structure. The inner ring 42, 53 however may also be free, i.e., only supported/positioned by the lamellas 44, 51.

By roughening the lamellas, the suppression of fast particles (e.g., Xe particles) coming from a radiation source in a lithographic apparatus is increased considerably. Prior art foil traps do not facilitate the suppression, i.e., removal and/or slow down, of fast particles emitted by a radiation source.

Figure 5A:
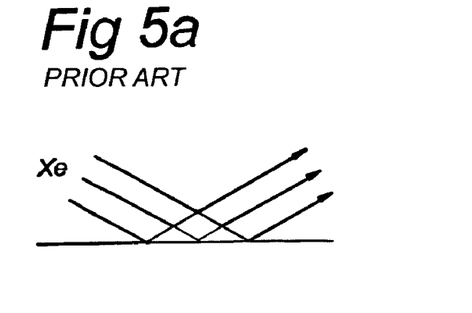
FIG. 5a depicts a cross-sectional view of a flat surface of a lamella of a contamination barrier according to the prior art.

Firstly, this is because the sticking probability of Xe is about zero (instead of close to 1 for atomic Molybdenum or Tungsten). Secondly, the fast Xe particles either do not meet the lamellas of the foil trap at all, or they impinge under a very grazing angle (as they follow a straight path from the radiation source, just like the light) with the lamellas, in which case they are predominantly specularly reflected (without losing significantly in kinetic energy), as shown in FIG. 5a.

Figure 5B:
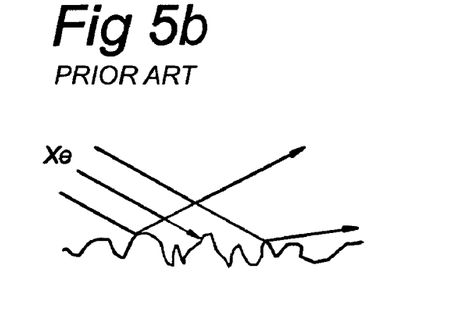
FIG. 5b depicts a cross-sectional view of a roughened surface of a lamella of a contamination barrier according to the prior art.

Roughened structures can be made relatively easy. The rough surface can be obtained by regular sand blasting. The platelets used today are cut out of just off-the-shelf sheet metal, which have a significant amount of surface roughness. Due to a roughened surface, the reflection of the Xe particles is reduced, compared to a flat surface. But still, Xe particles will reflect form such a surface, as shown in FIG. 5b.

Therefore, in a further aspect of the present invention, a contamination barrier, e.g., a foil trap, is provided including lamellas, the surface of which is jagged. In an embodiment, the surface of the lamellas is structured like saw teeth. The idea is based on the fact that a fast Xe particle at grazing incidence angle is reflected off a surface, whereas under more perpendicular incidence the particle is absorbed. By making the surface of the lamellas such that the Xe particles rarely impinge on the surface at grazing angles, most Xe particles will be absorbed, or stopped (loss of kinetic energy) and hence the sputtering problem for down stream optics is reduced. An embodiment of this surface structure is shown in FIG. 5c.

The original structure of the surface will, upon sputtering by the fast Xe particles, change over time. However, the surface roughness increases while exposed to fast particles, especially for ductile materials like metals. Further, one needs to ensure only a minimal amount of sputtered material will redeposit on the optics.

Figure 5C:
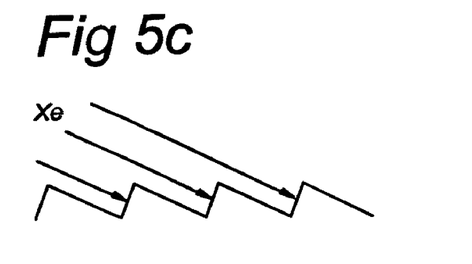
FIGS. 5c and 5d depict cross-sectional views of a roughened surface of a lamella of a contamination barrier according to the present invention.
Figure 5D:
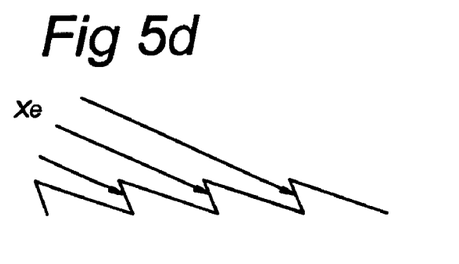

Another embodiment of a surface structure, depicted in FIG. 5d, could minimize this problem, as the redeposition of sputtered material will predominantly take place in trenches of the surface.

The structured lamellas shown in FIG. 5c may absorb Xe particles, resulting in sputtering of the lamella, whereas for a flat surface the sputtering is minimal. However, the lamella is predominantly sputtered at the entrance (i.e., the radiation source facing side) of the foil trap, and thus, given the high aspect ratio of the ducts of the foil trap, the likelihood of the sputtered material reaching the optics is small.

The surface structures of FIGS. 5c and 5d may be manufactured using diamond tooling, directional plasma etching, or even a replication method. For example, scratching the surface with a diamond tip, as is done for blazed gratings, is possible. Another option is 'stamping' as is done with coins. From a practical standpoint, the rough surface structure shown in FIG. 5b is implemented easiest.

It is noted that U.S. Pat. No. 6,359,969 also mentions the roughening of the surfaces of the lamellas, but it is not disclosed anywhere how the roughening looks nor how it is realized.

To make a foil trap more effective, fast Xe particles should hit the lamellas. In order to ensure this, the particles can be given an azimuthal component in the velocity. Therefore, according to a further aspect of the invention, a contamination barrier, e.g., a foil trap, is provided, wherein a force field is applied to particles that pass the lamellas. In an embodiment, the force field is a radial magnetic field, resulting in an azimuthal Lorentz-force on the Xe particles. The radial magnetic field may be produced with a rod-shaped magnet in the center of the foil trap. Another possibility is to produce the radial magnetic field with an electromagnet.

Figure 6:
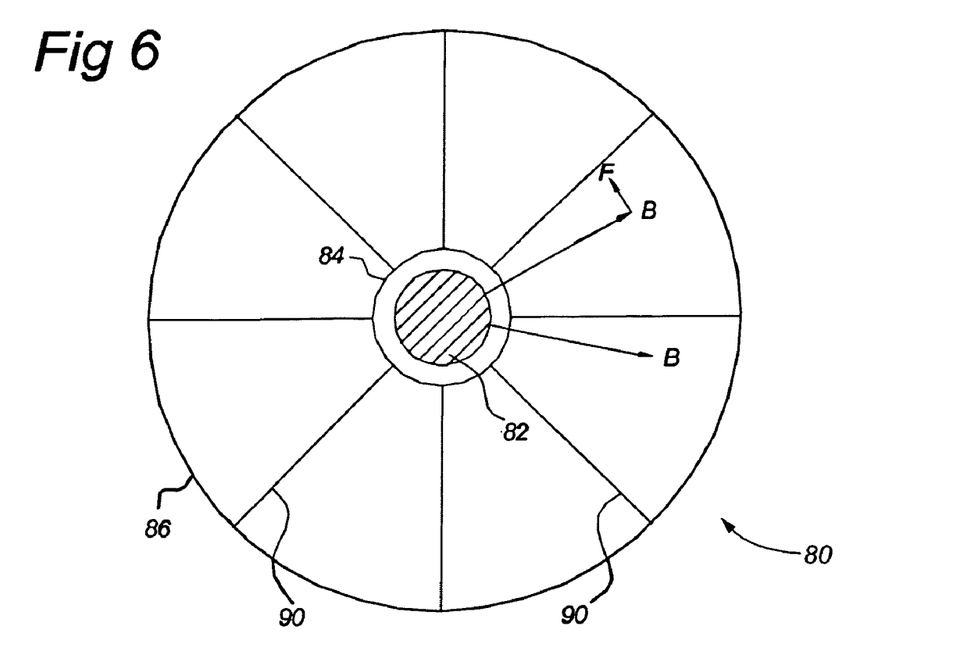
FIG. 6 depicts a contamination barrier according to an embodiment of the present invention with a rod shaped magnet inside to produce a radial magnetic field.
Figure 7:
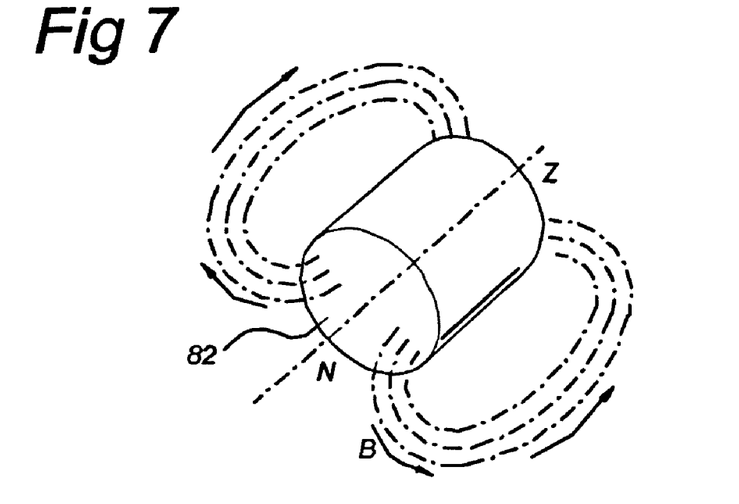
FIG. 7 depicts the magnet of FIG. 6 in more detail.

FIG. 6 depicts a contamination barrier 80, e.g., a foil trap, with a rod-shaped magnet 82 within an inner ring 84. Lamellas 90 are supported by the inner ring 84 and an outer ring 86. FIG. 7 depicts the rod-shaped magnet 82 in more detail. The rod-shaped magnet is mounted in such a way that it has one pole at the source side of the foil trap, and one pole at the collector side of the foil trap. Note that the magnetic field near a pole of the magnet is radial. This radial magnetic field causes a Lorentz force F, shown in FIG. 6, onto a passing charged particle, like a positively charged Xe particle. The particles thus receive an azimuthal velocity component. This will increase the number of Xe particles that hit a lamella 90, as shown in FIG. 6. Other magnet configurations are possible, for example a horse-shoe shaped magnet with one pole on the optical axis and another pole outside the foil trap. In that case, the magnet should be very thin in between the poles to minimize obstruction of the radiation passing the foil trap.

It should be appreciated that instead of to a "non focused foil trap," the principle of using a magnetic field in or near a foil trap also applies to other foil traps, like the "focused foil trap" described in U.S. Pat. No. 6,359,969. However, instead of realizing an azimuth Lorentz-force on the Xe particles, a radial Lorentz-force must be realized.

Figure 8:
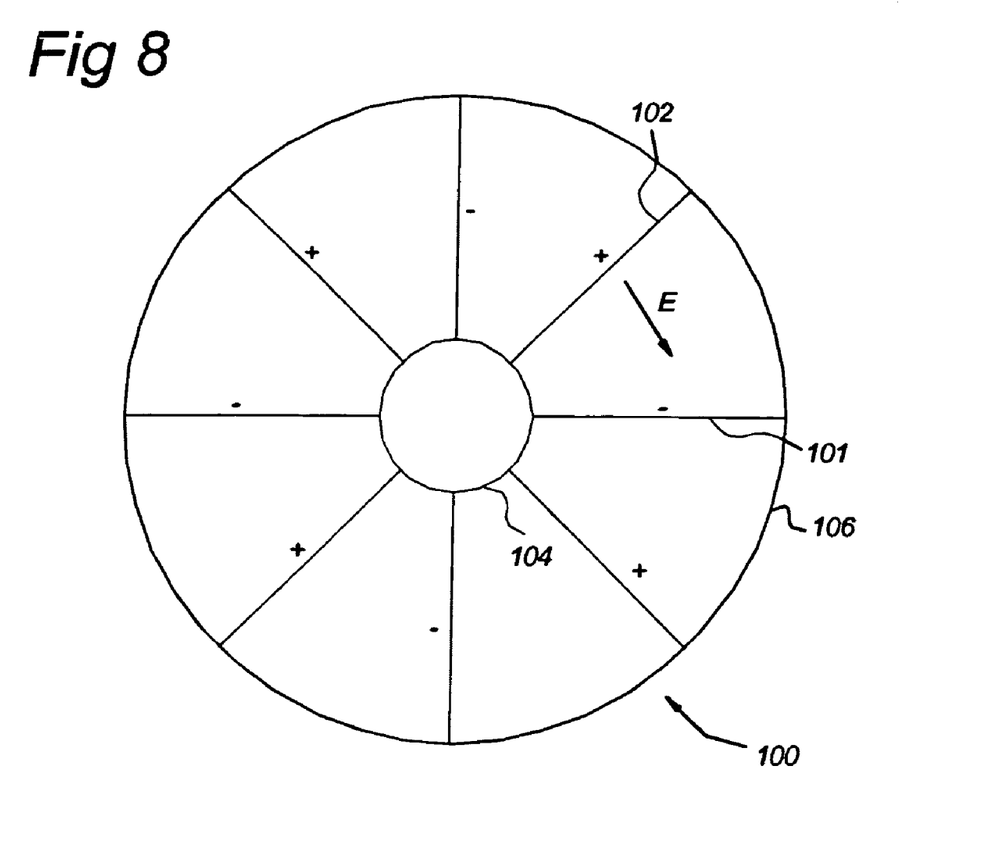
FIG. 8 depicts a contamination barrier according to an embodiment of the present invention with charged lamellas to produce an electrical field.

In another embodiment, the force field includes an electrical field, created by the lamellas, which are alternately charged positive and negative. In this embodiment, the lamellas may be formed as is described and shown in FIG. 3 or 4, but other configurations are possible. Referring to FIG. 8, a contamination barrier 100, e.g., a foil trap, is shown, wherein lamellas 101, 102 are radially directed as seen from a main axis of the foil trap 100. The lamellas 101, 102 are supported by an inner ring 104 and an outer ring 106. The lamellas 101, 102 are alternately charged positively or negatively. In FIG. 8, the lamellas 101 are charged negatively, and the lamellas 102 are charged positively. Charging of the lamellas 101, 102 can be realized by applying appropriate voltages. In FIG. 8 the direction of the electric field is shown by a vector E. The electric field will, for example, cause a positive Xe particle to turn off in the direction of a negatively charged lamella 101. This will increase the number of Xe particles that hit a lamella 101 of the foil trap 100.

While specific embodiments of the present invention have been described above, it will be appreciated that the invention may be practised otherwise than as described. The description is not intended to limit the present invention. For example, a second foil trap on the opposite side of the radiation source is also possible. This second foil trap will capture yet another amount of debris. This will minimize debris in the direction of the focus 30, shown in FIG. 2. Finally, it should be noted that the present invention is not limited to ellipsoidal shaped collectors. It should be appreciated that other curved collectors are possible as well.

What is claimed is:

1. A radiation system configured to provide a beam of radiation, the system comprising:
    a radiation source;
    a collector configured to collect radiation coming from the radiation source;
    a contamination barrier configured to trap contamination particles coming from the radiation source, the contamination barrier being positioned between the radiation source and the collector so as to pass through radiation coming from the radiation source, wherein the collector is configured so that radiation reflected by the collector will pass the contamination barrier and the contamination barrier comprises a plurality of planar lamellas, each lamella being positioned parallel to a propagation direction of the reflected radiation, the contamination barrier comprising an outer ring being configured to support the lamellas.

2. A radiation system according to claim 1, wherein the collector is configured such that the incidence of the radiation coming from the radiation source is substantially normal to a surface of the collector, the collector having a curved inner surface defining an ellipsoidal with a first focus and a second focus, the radiation source being situated in the first focus, and respective planes of the lamellas all intersect at a line through the first focus and second focus.

3. A radiation system according to claim 1, wherein the radiation source comprises a laser produced plasma source.

4. A radiation system according to claim 2, wherein the the outer ring has a diameter so that the outer ring is situated outside a conus formed by a circumference of the collector and the second focus.

5. A radiation system according to claim 4, wherein the outer ring is shaped as a slice of a cone.

6. A radiation system according to claim 1, wherein the contamination barrier comprises an inner ring configured to support the lamellas, the inner ring being shaped as a slice of a cone having its tip at approximately the position of the radiation source.

7. A lithographic projection apparatus, comprising:
    a radiation system configured to provide a beam of radiation, the system comprising:
        a radiation source;
        a collector configured to collect radiation coming from the radiation source;
        a contamination barrier configured to nap contamination particles coming from the radiation source, the contamination barrier being positioned between the radiation source and the collector so as to pass through radiation coming from the radiation source, wherein the collector is configured so that radiation reflected by the collector will pass the contamination barrier and the contamination barrier comprises a plurality of planar lamellas, each lamella being positioned parallel to a propagation direction of the reflected radiation, the contamination barrier comprising an outer ring being configured to support the lamellas;
    a support configured to support a patterning device, the patterning device configured to pattern the beam from the radiation system according to a desired pattern;
    a substrate table configured to hold a substrate; and
    a projection system configured to project the patterned beam onto a target portion of the substrate.

8. A device manufacturing method, comprising:
providing a beam of radiation using a radiation system comprising a radiation source, a collector configured to collect radiation coming from the radiation source, and a contamination barrier configured to trap contamination particles coming from the radiation source, the contamination barrier being positioned between the radiation source and the collector so as to pass through radiation coming from the radiation source, wherein the collector is configured so that radiation reflected by the collector will pass the contamination barrier and the contamination barrier comprises a plurality of planar lamellas, each lamella being positioned parallel to a propagation direction of the reflected radiation, the contamination barrier comprising an outer ring being configured to support the lamellas;
providing the beam with a pattern in its cross-section; and
projecting the patterned beam of radiation onto a target portion of the layer of radiation-sensitive material.

9. A contamination barrier comprising a plurality of lamellas, wherein surfaces of the plurality of the lamellas are jagged.

10. A contamination barrier comprising a plurality of lamellas, wherein the contamination barrier is configured to apply a force field to particles that pass the plurality of the lamellas such that the particles develop a velocity perpendicular to surfaces of the plurality of the lamellas.

11. A radiation system according to claim 1, wherein the lamellas have an approximately rectangular shape.

12. A radiation system according to claim 1, wherein lamellas have curved inner and outer edges in the respective planes so that the nearest edge to the radiation source is essentially circular.

13. A radiation system according to claim 5, wherein the cone has its tip at approximately the position of the radiation source.

14. A contamination barrier according to claim 9, wherein the jagged surfaces comprise sawtooth structures.

15. A contamination barrier according to claim 14, wherein the sawtooth structures comprise tips which lean over.

16. A contamination barrier according to claim 10, wherein the contamination barrier comprises a magnet for producing a magnetic field.

17. A contamination barrier according to claim 16, wherein the plurality of lamellas are planar and radially extend from a main axis of the contamination barrier, and the magnet is arranged to produce a radial magnetic field between the plurality of lamellas.

18. A contamination barrier according to claim 10, wherein the lamellas are configured to produce an electric force field between the lamellas.

19. A contamination barrier according to claim 18, wherein the plurality of lamellas are planar and radially extend from a main axis of the contamination barrier, and the plurality of lamellas are alternately charged positive and negative.

20. A lithographic projection apparatus, comprising:
a radiation system configured to provide a beam of radiation, the radiation system comprising a contamination barrier comprising a plurality of the lamellas each lamella being positioned parallel to a propagation direction of the reflected radiation, the contamination barrier comprising an outer ring being configured to support the lamellas, wherein the contamination barrier is configured to apply a force field to particles that pass the plurality of the lamellas such that the particles develop a velocity perpendicular to surfaces of the plurality of the lamellas;
a support configured to support a patterning device, the patterning device configured to pattern the beam from the radiation system according to a desired pattern;
a substrate table configured to hold a substrate; and
a projection system configured to project the patterned beam onto a target portion of the substrate.

21. A device manufacturing method, comprising:
providing a beam of radiation using a radiation system comprising a contamination barrier comprising a plurality of lamellas each lamella being positioned parallel to a propagation direction of the reflected radiation, the contamination barrier comprising an outer ring being configured to support the lamellas, wherein the contamination barrier is configured to apply a force field to particles that pass the plurality of the lamellas such that the particles develop a velocity perpendicular to surfaces of the plurality of the lamellas;
providing the beam with a pattern in its cross-section; and
projecting the patterned beam of radiation onto a target portion of the layer of radiation-sensitive material.

22. A device manufactured according to the method of claim 8.

23. A device manufactured according to the method of claim 21.

* * * * *